United States Patent [19]

Shekhawat et al.

[11] Patent Number: 4,891,532
[45] Date of Patent: Jan. 2, 1990

[54] DARLINGTON CONNECTED SWITCH HAVING BASE DRIVE WITH ACTIVE TURN-OFF

[75] Inventors: Sampat S. Shekhawat; John J. Dhyanchand, both of Rockford, Ill.

[73] Assignee: Sundstrand Corporation, Rockford, Ill.

[21] Appl. No.: 268,879

[22] Filed: Nov. 8, 1988

[51] Int. Cl.[4] .................. H03K 17/04; H03K 17/60
[52] U.S. Cl. ............................ 307/300; 307/254; 307/315
[58] Field of Search ............ 307/254, 300, 315, 362; 361/86

[56] References Cited

U.S. PATENT DOCUMENTS

| | | | |
|---|---|---|---|
| 3,814,957 | 6/1974 | Way | 307/310 |
| 4,055,794 | 10/1977 | Ickes et al. | 307/300 |
| 4,375,074 | 2/1983 | Glogolja | 361/91 |
| 4,410,810 | 10/1983 | Christen | 307/300 |
| 4,449,063 | 5/1984 | Ohmichi et al. | 307/456 |
| 4,508,976 | 4/1985 | Hickman et al. | 307/315 |
| 4,572,970 | 2/1986 | Allen et al. | 307/254 |
| 4,588,904 | 5/1986 | Glogolja | 307/300 |
| 4,590,395 | 5/1986 | O'Connor et al. | 307/570 |
| 4,701,635 | 10/1987 | Kawazoe et al. | 307/270 |
| 4,725,741 | 2/1988 | Shekhawat et al. | 307/315 |

Primary Examiner—John Zazworsky
Attorney, Agent, or Firm—Antonelli, Terry & Wands

[57] ABSTRACT

A Darlington connected switching circuit (20) having a bipolar driver transistor (22) and at least one driven transistor (24) having a rapid and reliable turn-off characteristic with low losses suitable for use in power applications such as inverters. The collector to emitter potential of the at least one driven transistor is sensed by a comparator (26) to produce an output signal for controlling the conduction of minority carriers from the base of the driven transistor in response to sensing that the emitter to collector potential has become greater in magnitude than a reference potential (Vref) applied to the comparator. The reference potential is chosen to be at least a function of the switching characteristic of the driven transistor. Appropriate selection of the reference potential applied to the comparator insures that the driver transistor is sufficiently turned off to prevent false turn-offs under light load conditions while additionally ensuring that the at least one driven transistor is rapidly turned off after the driver transistor has been turned sufficiently off to prevent possible false turn-offs.

27 Claims, 2 Drawing Sheets

DARLINGTON CONNECTED SWITCH HAVING BASE DRIVE WITH ACTIVE TURN-OFF

TECHNICAL FIELD

The present invention relates to switches having a high speed turn-off characteristic to minimize switching losses. More particularly, the present invention relates to switches of the aforementioned type utilizing Darlington connected power transistors.

BACKGROUND ART

The present invention is an improvement of the switch disclosed in U.S. Pat. No. 4,725,741. The Darlington connected power switch disclosed in the '741 patent achieves rapid turn-off. A pair of turn-off switches respectively control the turn-off of the Darlington connected power transistors by applying a negative base drive having a predetermined RC time constant to each power transistor. The RC time constants are chosen as a function of the switching characteristics of the Darlington connected power transistor switches. Characteristics of power transistor switches vary from manufacturer to manufacturer which requires the aforementioned time constants to be tuned to the particular power transistors being utilized. The aforementioned tuning makes it difficult to use a standard design which is disadvantageous.

Tuning of the time constants is necessary to achieve proper operation of the Darlington connected power transistor switches. Under light load conditions without appropriately chosen time constants, the driver transistor is subject to turn-off at a slower rate than the driven transistor. As a result of the slower turn-off of the driver transistor, the driven transistor is subject to turning back on as a consequence of the base drive of the driven transistor not being totally extinguished prior to turn-off of the driven transistor. The aforementioned tuning of a time constant in the turn-off switches of a Darlington connected switch of the '741 patent eliminates the aforementioned problem of turning back on the driven transistor as a consequence of slow turn-off of the driver transistor at the expense of requiring a different RC time constant to be chosen for transistors which are chosen for driving loads of different power requirements.

U.S. patent application Ser. No. 135,226, filed on Dec. 21, 1987, and assigned to the assignee of the present invention, discloses a Darlington connected switching circuit having a MOSFET as the driver transistor and a bipolar transistor as the driven transistor. Turn-off of the Darlington switch is not controlled as a function of the collector to emitter potential of the driven transistor as in the present invention.

U.S. Pat. No. 4,410,810 discloses a high speed switching circuit having a single bipolar transistor which monitors the collector to emitter potential of the transistor to sense when the transistor collector to emitter potential has reached a predetermined value indicative of the transistor being out of saturation. Negative base drive is applied to the bipolar transistor in response to sensing that the transistor collector to emitter potential has reached a predetermined value.

DISCLOSURE OF THE INVENTION

The present invention is an improvement of the Darlington connected switch disclosed in U.S. Pat. No. 4,725,741 discussed above. The invention achieves rapid turn off which minimizes switching losses. With the invention, tuning of the transistor turn-off circuits, which apply negative base drive to conduct minority carriers from the bases of the driver and driven transistors during turn-off, is eliminated. With the invention, the collector to emitter potential of the driven transistor is monitored to produce a control signal which activates a transistor turn-off circuit, which causes the application of a large negative base drive for conducting minority carriers from the base of the driven transistor to a reference potential when the driver transistor has already been sufficiently turned off to insure that the driver transistor will be totally turned off. Use of the collector to emitter potential to generate the control signal enables the turning off circuit to dynamically adjust to load variations and operate to turn off power transistors of differing switching characteristics without tuning. As a consequence of applying a large negative base drive to conduct minority carriers from the base of a driven transistor after the driver transistor is sufficiently turned off to insure complete turn-off, rapid turn-off of the driven transistor is achieved. Preferably, the collector to emitter potential of the driven transistor is monitored by a comparator which produces the control signal for activating the transistor turn-off circuit that conducts the minority carriers from the base of the driven transistor. The comparator output potential changes level in response to the collector to emitter potential of the driven transistor becoming larger than a reference potential. The reference potential is varied to accomplish "tuning" of the turn-off circuit to the switching characteristics of at least the driven transistor without requiring adjustment of an RC time constant in a turn-off circuit as in U.S. Pat. No. 4,725,741. Variation of the reference potential permits power transistors having differing switching characteristics to be used in a standard circuit design without variation of an RC time constant in the turn-off circuit.

A switching circuit having a driver transistor and at least one bipolar driven transistor with a base of the driven transistor being coupled to a non-inverting output of the driver transistor and inverting outputs of the driver and the at least one driven transistor being connected together in accordance with the invention comprises a control circuit, coupled to the inverting outputs of the driver and the at least one driven transistor, for producing a control signal for controlling a time at which the driven transistor turns off as a function of a collector to emitter potential of the driven transistor; and a turn-off circuit, responsive to the control signal for conducting minority carriers from a base of the driven transistor in response to the control signal. The turn-off circuit comprises a turn-off transistor, having a control terminal coupled to the output of the control circuit for producing a control signal, a first output coupled to a base of the driven transistor, and a second output coupled to a reference potential with the turn-off transistor turning on in response to the control signal to cause minority carriers to flow from a base of the driven transistor to the reference potential. The control circuit is responsive to the collector to emitter potential of the driven transistor and to a reference voltage having a magnitude chosen as a function of switching characteristics of the driven transistor and produces the output signal in response to the collector to emitter potential of the driven transistor becoming greater in magnitude than the reference voltage.

In a Darlington connected switch having a circuit for controlling the turning off of a driver transistor and at least one driven transistor, an improvement in accordance with the invention includes a comparator having two inputs and an output, the first input being coupled to inverting outputs of the driver transistor and at the least one driven transistor and the second input being coupled to a reference potential chosen as a function of at least switching characteristics of the at least one driven transistor, for controlling a time at which the at least one driven transistor turns off, the comparator output changing from a first potential to a second potential when the first input changes in magnitude with respect to the second input from being less than the second input to greater than the second input; and a turn-off circuit, responsive to the output of the comparator, for applying a negative base drive to the driven transistor for conducting minority carriers from a base of the at least one driven transistor in response to the second level of the output of the comparator. Preferably, the turn-off circuit comprises a turn-off transistor, having a control terminal coupled to the output of the comparator, a first output coupled to a base of the at least one driven transistor, and a second output coupled to a reference potential. The turn-off transistor turns on in response to the output of the comparator changing level to apply a negative base drive to cause minority carriers to flow from the base of the at least one driven transistor to the reference potential.

A switching circuit having a driver transistor and at least one bipolar driven transistor with a base of the at least one driven transistor being coupled to a non-inverting output of the driver transistor and inverting outputs of the driver and the at least one driven transistor being connected together in accordance with the invention includes a comparator having two inputs and an output, the first input being coupled to the inverting outputs of the driver transistor and at least one driven transistor and the second input being coupled to a reference potential, for controlling a time at which the at least one driven transistor is turned off, the comparator output changing from a first potential to a second potential when the first input changes in magnitude with respect to the second input from being less than the second input to greater than the second input; and a turn-off transistor, having a control terminal coupled to the output of the comparator, a first output coupled to a base of the at least one driven transistor and a second output coupled to a reference potential, the turn-off transistor turning on in response to the output of the comparator changing level to apply a negative base drive to cause minority carriers to flow from the base of the driven transistor to the reference potential. Preferably, the reference potential is chosen as a function of at least switching characteristics of the at least one driven transistor. The driver transistor may be a bipolar transistor, and the turn-off transistor may be a MOSFET. Further in accordance with the invention, a switching signal source is provided for coupling a switching signal having recurring first and second levels to a control terminal of the driver transistor to cause the driver transistor and the at least one driven transistor to turn-on in response to the first level of the switching signal and to turn-off in response to the second level of the switching signal. The driver transistor and at least one driven transistor are contained in an inverter with output terminals of the driven transistor being coupled between a reference potential and a phase output of the inverter. The switching signal may be a pulse width modulation control signal for pulse width modulating the phase output of the inverter. A gate is provided having a pair of inputs and an output which is coupled to a control terminal of the driver transistor, the first input being coupled to the switching signal source and the second input being coupled to the output of the comparator, the output of the gate having a first level when both of the inputs are at a first level and a second level when either of the inputs are at a second level, and the driver transistor and at least one driven transistor turning on in response to the output of the gate being the first level and turning off in response to the output being the second level. A shunt circuit is provided coupling the second input of the gate to the output of the gate to couple the switching signal source to the driver transistor and at least one driven transistor upon application of power to the switching circuit to permit the driver transistor and at least one driven transistor to be turned on in response to a first signal from the switching signal source. The shunt circuit is a differentiation circuit having an RC time constant for coupling a pulse having a duration which is a function of the RC time constant to the driver transistor and at least one driven transistor in response to the control signal.

A Darlington connected switching circuit having a driver transistor and at least one driven transistor in accordance with the invention includes a comparator having two inputs and an output, the first input being coupled to inverting outputs of the driver transistor and at least one driven bipolar transistor and the second input being coupled to a reference potential for controlling a time at which the at least one driven transistor is turned off, the comparator output changing from a first potential to a second potential when the first input changes in magnitude with respect to the second input from being less than the second input to greater than the second input; and a turn-off transistor, having a control terminal coupled to the output of the comparator, a first output coupled to a base of the at least one driven transistor, and a second output coupled to a reference potential, the turn-off transistor turning on in response to the output of the comparator changing level for applying a negative base drive to a control terminal of the at least one driven transistor to cause minority carriers to flow from the base of the at least one driven transistor to a reference potential. Preferably, the reference potential applied to the comparator is chosen as a function of a switching characteristic of the at least one driven transistor. A switching signal source is provided for coupling a switching signal having recurring first and second levels to a control terminal of the driver transistor to cause the driver transistor and the at least one driven transistor to turn-on in response to the first level of the switching signal and to turn-off in response to the second level of the switching signal. The driver and at least one driven transistor may be contained in an inverter with output terminals of the at least one driven transistor being coupled between a reference potential and a phase output of the inverter. The switching signal may be a pulse width modulation control signal for pulse width modulating the phase output of the inverter.

BEST MODE FOR CARRYING OUT THE INVENTION

Figure 1:
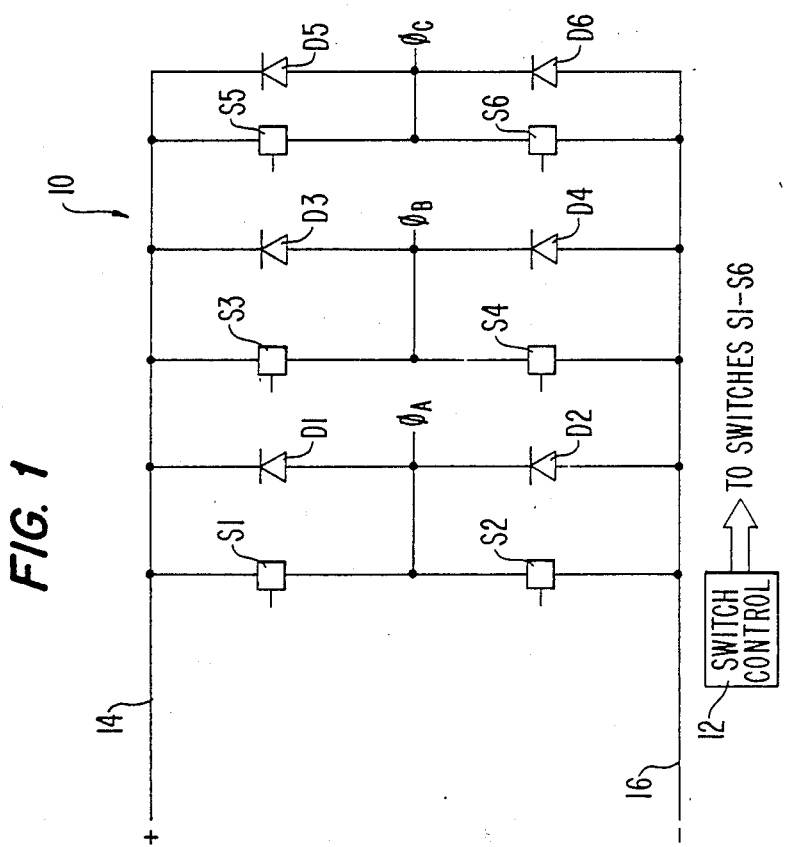
FIG. 1 is a block diagram illustrating an application of a switching circuit in accordacce with the present invention.

FIG. 1 illustrates an inverter 10 using a plurality of switching circuits S1-S6 in accordance with FIG. 2 of the present invention discussed below. Furthermore, it should be understood that a switching circuit in accordance with the invention may be utilized in other applications including inverters of differing design. An inverter utilizing switching circuits of the present invention has low switching losses. Inverter 10 includes switches S1-S6 which are sequentially switched into a conductive state by switch control 12 to couple either the positive rail 14 or negative rail 16 to phase outputs $\theta_A$-$\theta_C$. Furthermore, in accordance with the conventional design of the inverter 10 as illustrated in FIG. 1, anti-parallel diodes D1-D6 are coupled in parallel respectively to switches S1-S6. The switching circuit of the present invention is especially useful in inverters as a consequence of its rapid turn-off characteristic which permits the on interval of the switch to be precisely pulse width modulated to produce sinusoidal phase outputs without substantial harmonics. Furthermore, it should be understood that the present invention may be utilized with other switching circuits such as choppers and proportional base drive circuits.

Figure 2:
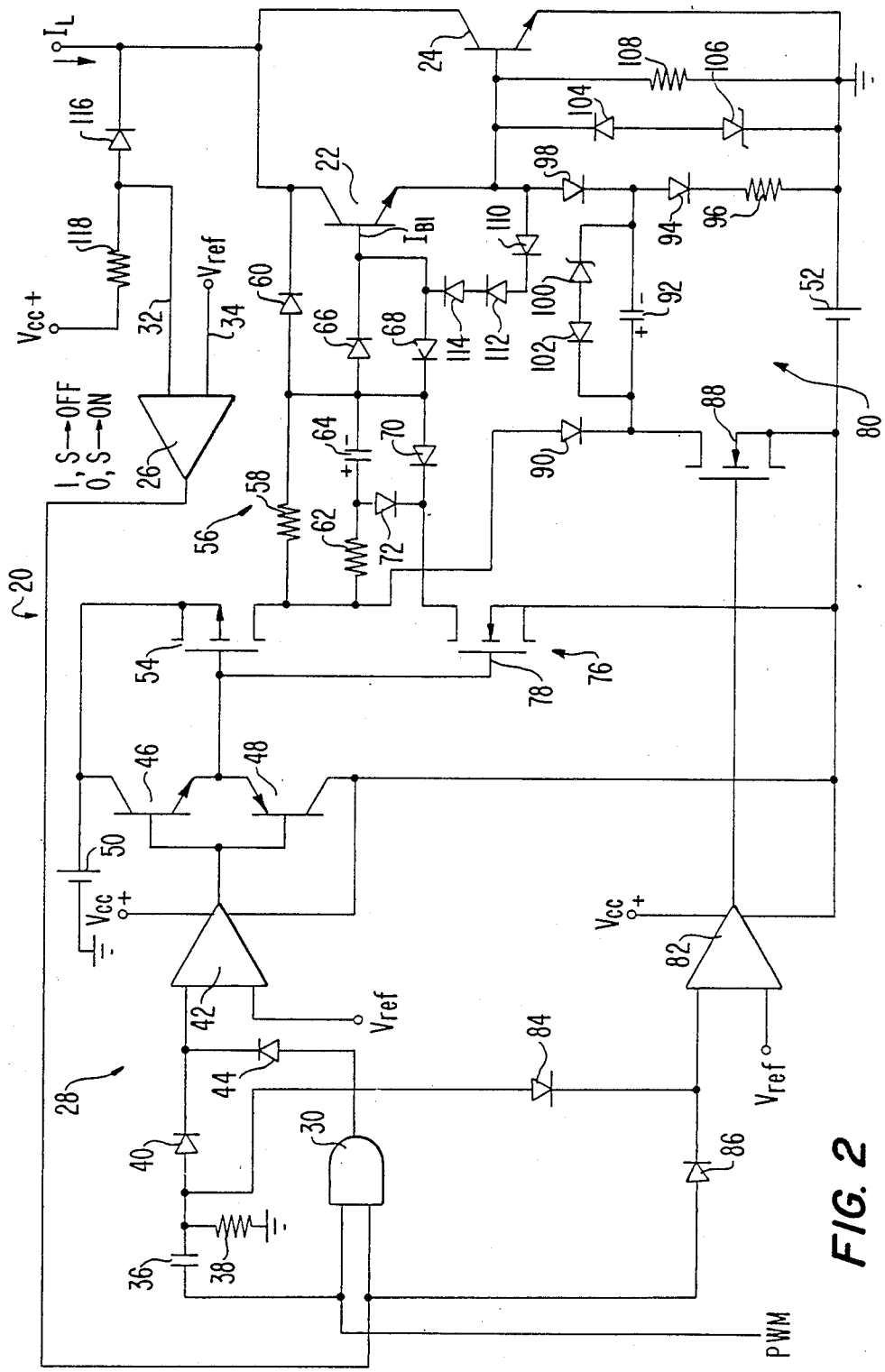
FIG. 2 is a circuit diagram of a switching circuit in accordance with the present invention.

FIG. 2 illustrates an embodiment 20 of a switching circuit in accordance with the present invention. The switching circuit has a bipolar transistor 22 and at least one bipolar transistor 24 connected in a conventional Darlington configuration. It should be understood that a single driven transistor 24 has been illustrated for purposes of simplifying the illustration with it further being understood that a plurality of parallel connected driven transistors may be driven by the driver transistor. The first bipolar transistor 22 functions as a driver transistor and the second bipolar transistor 24 functions as a driven transistor. The driven transistor 24 may be utilized to switch a load current IL which flows between a potential of several hundred volts to ground potential. Rapid turn-off of the driven transistor 24 is produced by a turn-off circuit described below which applies a large negative base drive to the driven transistor after the driver transistor 22 has turned off sufficiently to insure that the driver transistor will be totally turned off by the time that turn-off of the driven transistor is complete. This sequence is important in producing rapid controllable turn-off with low switching losses which is useful in applications such as inverters.

The turn-off circuit is activated by a control signal produced by comparator 26. The comparator 26 produces the control signal in response to the collector to emitter potential on line 32 becoming greater in magnitude than a reference voltage Vref on line 34. Variation of the reference potential to precisely control turn-off of the driver transistor as a function of its switching characteristics is much more versatile than tuning an RC time constant as in U.S. Pat. No. 4,725,741.

The magnitude of the voltage Vref is chosen in accordance with the switching characteristics of at least the driven power transistor 24 to optimize the rapid turn-off of the driven transistor which eliminates tuning of an RC time constant as in the prior art. Typically, Vref is chosen to be between 5 and 10 volts. The comparator 26 outputs a control signal of a low level when the collector to emitter potential across the driven transistor 24 as coupled to input 32 is less than the reference voltage Vref coupled to second input 34 and outputs a signal of a high level when the collector to emitter voltage of the driven transistor 24 coupled to the input 32 is greater than the voltage Vref coupled to the second input.

The turn-on of the switching circuit 20 is controlled by a turn-on circuit 28 described as follows. AND gate 30 produces a high level signal each time the output of the comparator 26 is the first high level at the same time that the signal from pulse width modulation source PWM applied to the input of the AND gate is high. As illustrated, the switching circuit state "S" of the Darlington connection is off when the comparator 26 output level is high (1) and the state "S" is on when the comparator output level is low (0). A shunt circuit is coupled between the input from the pulse width modulation source and the output of the AND gate 30. The shunt circuit is a differentiation circuit comprised of a capacitor 36 coupled in series with a resistor 38 which is coupled to ground or another suitable voltage reference. Diode 40 couples a positive high level differentiated pulse having a width determined by the RC time constant of the capacitor 36 and resistor 38 to a first input of comparator 42. A voltage reference Vref which may be 2 or more volts is applied to the second input of comparator 42 to provide noise immunity so that the output of the comparator only goes low when the input voltage is greater in magnitude than Vref. Diode 44 couples a positive high level output signal from AND gate 30 to the first input of the comparator 42. The function of the shunt circuit is to permit the driver transistor 22 and the driven transistor 24 to be turned on upon powering up of the switching circuit 20 at which time the output of the comparator 26 would be in the first low level state which would cause AND gate 30 to block a high level signal from being applied to the comparator 42 which is necessary for turning on the driver and driven transistors. Opposite conductivity type bipolar transistors 46 and 48, which are in a totem pole configuration, have common bases which are coupled to the output of the comparator 42. Comparator 42 goes low in response to a positive input from AND gate 40 or diode 44. The collector to emitter circuits of the bipolar transistors 46 and 48 are coupled in series between a positive terminal of battery 50 and a negative terminal of battery 52. The bipolar transistor 48 is conductive in response to a low output from comparator 42 to cause an amplified negative switching signal to be applied to MOSFET 54 which applies driving current to driver transistor 22 to control the turning on of the driver transistor and the driven transistor 24 and the bipolar transistor 46 is rendered on in response to the comparator going high to cause an amplified positive switching signal to be applied to MOSFET 78 to control the turning off of the driver transistor. Output current from the MOSFET 54 is applied to a pulse shaping network 56 which is comprised of resistor 58, diode 60, resistor 62, capacitor 64, diode 66, diode 68, diode 70 and diode 72. Upon the output of the MOSFET 54 going high, base drive current $I_{B1}$ rises exponentially as determined by the RC time constant of the parallel circuit comprised of the series connection of resistance 62 and capacitor 64 with resistance 58. Capacitor 64 is charged during turn-on with a polarity as noted. The potential stored on capacitor 64 assists the turn-off of the driver transistor 22 as described below by assisting in the generation of a large negative base drive to the driver transistor. The current $I_{B1}$ thereafter decreases exponentially to a steady state value determined the resistance 58. The bipolar driver transistor 22 may be operated substantially at or slightly below the edge of saturation as a consequence of a "Baker clamp" comprised of diodes 60, 66 and 68 which bias the base to collector junction of the driver transistor 22 so that the driver transistor operates in an on state in a quasi-saturation or desaturation mode by effectively increasing the magnitude of the collector to emitter potential across the driver transistor which is necessary to keep the driven transistor in quasisaturation. Diode 72 is provided to insure that capacitor 64 is not charged by current flow from the base of the driver transistor 22.

A turn-off network 76 is provided for controlling the turning off of the driver transistor 22. The turn-off network 76 utilizes MOSFET 78, which is of an opposite conductivity type than the MOSFET 54 that insures that the MOSFETs 54 and 78 have complementary conductive states, to apply a high negative base drive to insure rapid turn-off of driver transistor 22. Upon switching of the MOSFET 78 into conduction, a negative base drive substantially equal to the sum of the potential stored on capacitor 64 and the potential of battery 52 is applied to the base of the driver transistor to cause it to rapidly turn-off. Minority carriers initially flow from the base of the driver transistor 22 through diode 68, capacitor 64, diode 72 and through the conductive MOSFET 78 to the battery potential 52. Thereafter the minority carrier flow through the diodes 68 and 70 and conductive MOSFET 76 to the battery potential.

A turn-off network 80 is provided for controlling the turning off of the bipolar driven transistor 24 in response to a change in potential of the output of comparator 26. The output of the comparator 26 is coupled to a first input of comparator 82 which has a second reference potential Vref of a positive 2 or more volts which provides noise immunity so that the output of the comparator only goes high when the input voltage is less in magnitude than Vref. Diode 84 functions to conduct the negative going pulses produced by the differentiation circuit of capacitor 36 and resistor 38 to the comparator 82 to control turn-off of MOSFET 88 to permit the capacitor 92 to be charged and the driver and driven transistors 24 and 26 to be turned on. Diode 86 couples the output signal of the comparator 26 to the first input of the comparator 82. Turning on of MOSFET 88 applies a high negative base drive to the base of driven transistor 24 to conduct minority carriers from the base of driven transistor in response to the output of the comparator 82 going high. The high negative base drive is substantially equal to the potential stored on capacitor 92 and the potential of battery 52. During conduction of the MOSFET 54, current flows from the battery 50 through the conductive MOSFET 54 through diode 90, capacitor 92, diode 94 and resistor 96 to charge the capacitor with the noted polarity which is substantially equal to the potential of the battery 50. Upon turning on of the MOSFET 88, the base of the driven transistor 24 is driven highly negative as a consequence of the sum of the voltage drops across the charged capacitor 92 and the battery 52. Initially, when MOSFET 88 turns-on, minority carriers flow from the base of transistor 24 through diode 98, capacitor 92 and through the turned MOSFET to reference potential. Thereafter, the minority carriers flow through the series circuit of diode 98, Zener diode 100 and diode 102 through the conductive MOSFET 88 to the battery potential. As a consequence of the MOSFET 88 becoming conductive in response to the detection of the collector to emitter potential of the driven transistor 24 reaching the predetermined reference voltage level Vref as determined by comparator 26, rapid reliable turn-off of the bipolar driver transistor 22 and bipolar driven transistor 24 is insured without false turn-offs of the driven transistor.

Additional circuit elements are described as follows. The series circuit of diode 104 and Zener diode 106 protects the base to emitter junction of the bipolar driven transistor 24 against high potentials during turn-off. Resistor 108 limits the drive current applied by battery 52 during turn-off. The series circuit of diodes 110, 112 and 114 provide a base to emitter potential of at least $-2$ volts to insure rapid turn-off capability of the Darlington switch. Diode 116 prevents current flow from the load to the comparator 26. Resistor 118 limits the magnitude of current flow from the power supply to the driver transistor 22 and driven transistor 24 during conduction.

The switching circuit 20 in accordance with the present invention operates as follows. Upon initial powering up of the switching circuit 20, the first pulse applied from the pulse width modulation source is differentiated by the differentiation circuit comprised of the capacitor 36 and the resistor 38. The pulse is amplified by the comparator 42 which causes transistor 48 to turn-on which activates MOSFET 54. A positive going pulse is produced by the output of MOSFET 54. The RC time constant of resistors 58, 60 and 62 and capacitor 64 causes a positive going pulse to be applied to the base of driver transistor 22 which causes the driver transistor and the driven transistor 24 to turn-on. Turning on of the driven transistor 24 causes current to flow through resistor 118, diode 116 and conductive driver transistor 22 and driven transistor 24 to ground. The aforementioned current flow produces a low level input on the input 32 of the comparator 26 which is less in magnitude than the magnitude of the voltage Vref applied to the input 34 which causes the output signal to be low. As the initial pulse width modulation signal goes low, transistor 48 is turned off and transistor 46 is turned on causing MOSFET 78 to turn-on and MOSFET 54 to turn-off. Turning on of MOSFET 78 causes the base of driver transistor 22 to be driven highly negative. The turning off of driver transistor 22 causes driven transistor 24 to begin to turn-off which causes the potential across the collector to emitter junction to rise. Rising of the collector to emitter potential of the driven transistor 24 causes the potential at input 32 of the comparator 26 to rise which causes the output to change to a high level at the time that the input 32 is greater in magnitude than the input 34 of Vref which is determined as a function of the switching characteristics of at least the driven transistor 24. Appropriate choice of the reference voltage Vref enables the precise time to be sensed at which driven transistor 24 has begun to turn far enough off that coupling of a high reverse bias potential to the base thereof will cause the minority carriers to be conducted from the base region to rapidly turn-off the driven transistor at a point at which the driver transistor 22 is already sufficiently turned off where it will rapidly and reliably be turned off which eliminates false turn-offs and further permits utilization of a switching circuit in accordance with the invention with power transistors in a Darlington configuration without requiring tuning of time constants as a function of switching characteristics of the driver and driven bipolar transistors as in the U.S.

Pat. No. 4,725,741. The output of comparator 82 goes high in response to the output of the comparator 26 going high which turns on MOSFET 88. The stored charge on capacitor 92 caused by the conduction of MOSFET 54 causes an additive negative potential substantially equal to the sum of the potential of battery 50 and the battery 52 to be applied to the base of the bipolar driven transistor 24 to ensure a sufficiently high negative base drive to cause rapid turn-off as a consequence of MOSFET 88 being heavily biased into forward conduction in response to the output of comparator 82 going positive. Thereafter, each successive positive pulse width modulation control signal causes AND gate 30 to be forward biased as a consequence of the output of comparator 26 being high when the bipolar driver and driven transistors 22 and 24 are turned on which causes the above-referenced cycle to be repeated.

While the invention has been described in terms of its preferred embodiment, it should be understood that numerous modifications may be made thereto without departing from the spirit and scope of the invention as defined in the appended claims. It is intended that all such modifications fall within the scope of the appended claims.

We claim:

1. A switching circuit having a driver transistor and at least one bipolar driven transistor with a base of the at least one driven transistor being coupled to a non-inverting output of the driver transistor and inverting outputs of the driver and at last one driven transistor being connected together comprising:

a comparator having two inputs and an output, the first input being coupled to the inverting outputs of the driver and at least one driven transistor and the second input being coupled to a reference potential, for controlling a time at which the at least one driven transistor is turned off, the comparator output changing from a first potential to a second potential when the first input changes in magnitude with respect to the second input from being less than the second input to greater than the second input; and a turn-off transistor, having a control terminal coupled to the output of the comparator, a first output coupled to a base of the at least one driven transistor, and a second output coupled to a reference potential, the turn-off transistor turning on in response to the output of the comparator changing potential from the first potential to the second potential to cause a reverse base drive to be applied to the base of the driven transistor to cause minority carriers to conduct from the base of the driven transistor to the reference potential.

2. A switching circuit in accordance with claim 1 wherein:
   the reference potential is chosen as a function of at least the switching characteristics of the at least one driven transistor.

3. A switching circuit in accordance with claim 1 wherein:
   the turn-off transistor is a MOSFET.

4. A switching circuit in accordance with claim 2 further comprising:
   a switching signal source for coupling a switching signal having recurring first and second levels to a control terminal of the driver transistor to cause the driver transistor and the at least one driver transistor to turn-on in response to the first level of the switching signal and to turn-off in response to the second level of the switching signal.

5. A switching circuit in accordance with claim 3 further comprising:
   a switching signal source for coupling a switching signal having recurring first and second levels to a base of the driver transistor to cause the driver and the at least driven transistor to turn-on in response to the first level of the switching signal and to turn-off in response to the second level of the switching signal.

6. A switching circuit in accordance with claim 4 wherein:
   the driver and at least one driven transistor are contained in an inverter with output terminals of the at least one driven transistor being coupled between a reference potential and a phase output of the inverter.

7. A switching circuit in accordance with claim 5 wherein:
   the driver transistor and at least one driven transistor are contained in an inverter with output terminals of the at least one driven transistor being coupled between a reference potential and a phase output of the inverter.

8. A switching circuit in accordance with claim 6 wherein:
   the switching signal is a pulse width modulation control signal for pulse width modulating the phase output of the inverter.

9. A switching circuit in accordance with claim 7 wherein:
   the switching signal is a pulse width modulation control signal for pulse width modulating the phase output of the inverter.

10. A switching circuit in accordance with claim 4 further comprising:
    a gate having a pair of inputs and an output which is coupled to a control terminal of the driver transistor, the first input being coupled to the switching signal source and the second input being coupled to the output of the comparator, the output of the gate having a first level when both of the inputs are at the first level and a second level when either of the inputs are at the second level, and the driver and at least one driven transistor turning on in response to the output of the gate being the first level and turning off in response to the output being the second level.

11. A switching circuit in accordance with claim 5 further comprising:
    a gate having a pair of inputs and an output which is coupled to a control terminal of the driver transistor, the first input being coupled to the switching signal source and the second input being coupled to the output of the comparator, the output of the gate having a first level when both of the inputs are at the first level and a second level when either of the inputs are at the second level, and the driver and at least one driven transistor turning on in response to the output of the gate being the first level and turning off in response to the output being the second level.

12. A switching circuit in accordance with claim 10 further comprising:
    a shunt circuit coupling the second input of the gate to the output of the gate to couple the switching signal source to the driver transistor and at least one driven transistor upon application of power to the switching circuit to permit the driver transistor and at least one driven transistor to be turned on in response to a first pulse from the switching signal source.

13. A switching circuit in accordance with claim 12 wherein the shunt circuit comprises:
a differentiation circuit having an RC time constant for coupling a pulse having a duration which is a function of the RC time constant to the driver transistor and the at least one driven transistor in response to the first pulse.

14. A switching circuit in accordance with claim 11 further comprising:
a shunt circuit coupling the second input of the gate to the output of the gate to couple the switching signal source to the driver transistor and at least one driven transistor upon application of power to the switching circuit to permit the driver transistor and at least one driven transistor to be turned on in response to a first pulse from the switching signal source.

15. A switching circuit in accordance with claim 14 wherein the shunt circuit comprises:
a differentiation circuit having an RC time constant for coupling a pulse having a duration which is a function of the RC time constant to the driver transistor and the at least one driven transistor in response to the first pulse.

16. A switching circuit having a Darlington connection of a driver transistor and at least one driven transistor comprising:
a comparator having two inputs and an output, the first input being coupled to inverting outputs of the driver transistor and at least one driven transistor and the second input being coupled to a reference potential with the reference potential being chosen as a function of at least the switching characteristics of at least the driven transistor, for controlling a time at which the at least one driven transistor is turned off, the comparator output changing from a first potential to a second potential when the first input changes in magnitude with respect to the second input from being less than the second input to greater than the second input; and
a turn-off transistor, having a control terminal coupled to the output of the comparator, a first output coupled to a base of the at least one driven transistor, and a second output coupled to a reference potential, the turn-off transistor turning on in response to the output potential of the comparator changing from the first potential to the second potential to apply a negative base drive to the base of the driven transistor to cause minority carriers to flow from the base of the at least one driven transistor to the reference potential.

17. A switching circuit in accordance with claim 16 further comprising:
a switching signal source for coupling a switching signal having recurring first and second levels to a control terminal of the driver transistor to cause the driver transistor and the at least one driven transistor to turn-on in response to the first level of the switching signal and to turn-off in response to the second level of the switching signal.

18. A switching circuit in accordance with claim 17 wherein:
the driver transistor and at least one driven transistor are contained in an inverter with output terminals of the at least one driven transistor being coupled between a reference potential and a phase output of the inverter.

19. A switching circuit in accordance with claim 18 wherein:
the switching signal is a pulse width modulation control signal for pulse width modulating the phase output of the inverter.

20. A switching circuit in accordance with claim 18 further comprising:
a gate having a pair of inputs and an output which is coupled to a control terminal of the driver transistor, the first input being coupled to the switching signal source and the second input being coupled to the output of the comparator, the output of the gate having a first level when both of the inputs are at the first level and a second level when either of the inputs are at the second level, and the driver transistor and at least one driven transistor turning on in response to the output of the gate being the first level and turning off in response to the output being the second level.

21. A switching circuit in accordance with claim 20 further comprising:
a shunt circuit coupling the second input of the gate to the output of the gate to couple the switching signal source to the driver transistor and at least one driven transistor upon application of power to the switching circuit to permit the driver transistor and at least one driven transistor to be turned on in response to a first pulse from the switching signal source.

22. A switching circuit in accordance with claim 21 wherein the shunt circuit comprises:
a differentiation circuit having an RC time constant for coupling a pulse having a duration which is a function of the RC time constant to the driver transistor and at least one driven transistor in response to the first pulse.

23. In a switching circuit having a Darlington connection of a driver transistor and at least one driven transistor including a circuit for controlling the turning off of the driver transistor and the at least one driven transistor, the improvement comprising:
a comparator having two inputs and an output, the first input being coupled to inverting outputs of the driver transistor and the at least one driven transistors and the second input being coupled to a reference potential, for controlling a time at which the at least one driven transistor is turned off, the comparator output changing from a first potential to a second potential when the first input changes in magnitude with respect to the second input from being less than the second input to greater than the second input; and
means, responsive to the output of the comparator, for conducting minority carriers from a base of the at least one driven transistor in response to the second level of the output of the comparator.

24. A switching circuit in accordance with claim 23 wherein:
the reference potential is chosen as a function of at least the switching characteristics of the driven transistor.

25. A switching circuit in accordance with claim 24 wherein the means for conducting minority carriers comprises:

a turn-off transistor, having a control terminal coupled to the output of the comparator, a first output coupled to a base of the at least one driven transistor, and a second output coupled to a reference potential, the turn-off transistor turning on in response to the output of the comparator changing to the second level to cause minority carriers to flow from the base of the at least one driven transistor to the reference potential.

26. A switching circuit having a driver transistor and at least one bipolar driven transistor with a base of the at least one driven transistor being coupled to a non-inverting output of the driver transistor and inverting outputs of the driver transistor and at last one driven transistor being connected together comprising:

means for producing a control signal for controlling a time at which the driven transistor turns off as a function of a collector to emitter potential of the driven transistor with the control signal being produced at a time which is determined by a reference potential magnitude chosen as a function of at least the switching characteristics of the at least one driven transistor; and means, responsive to the control signal for conducting minority carriers from a base of the driven transistor in response to the control signal.

27. A switching circuit in accordance with claim 26 wherein the means for controlling a time at which the driven transistor turns off comprises:

a turn-off transistor, having a control terminal coupled to the output of the means for producing the control signal, a first output coupled to a base of the at least driven transistor, and a second output coupled to a reference potential, the turn-off transistor turning on in response to the control signal to cause minority carriers to flow from a base of the driven transistor to the reference potential.

* * * * *